United States Patent
Nam et al.

(10) Patent No.: US 12,199,626 B2
(45) Date of Patent: Jan. 14, 2025

(54) DYNAMIC HIGH-RESOLUTION ANALOG TO DIGITAL CONVERTER AND OPERATING METHOD THEREOF

(71) Applicant: ELECTRONICS AND TELECOMMUNICATIONS RESEARCH INSTITUTE, Daejeon (KR)

(72) Inventors: Hong Soon Nam, Daejeon (KR); Jae Young Kim, Seoul (KR); Youn Kwae Jeong, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 120 days.

(21) Appl. No.: 17/973,785

(22) Filed: Oct. 26, 2022

(65) Prior Publication Data
US 2023/0136534 A1 May 4, 2023

(30) Foreign Application Priority Data

Nov. 1, 2021 (KR) .......................... 10-2021-0148160
Sep. 6, 2022 (KR) .......................... 10-2022-0112593

(51) Int. Cl.
*H03M 1/00* (2006.01)
*H03M 1/06* (2006.01)

(52) U.S. Cl.
CPC .............................. *H03M 1/0617* (2013.01)

(58) Field of Classification Search
CPC ........ H03M 1/183; H03M 1/185; H03M 1/12; H03M 1/162; H03M 1/18; H03M 1/38;
(Continued)

(56) References Cited

U.S. PATENT DOCUMENTS 5,144,311 A * 9/1992 Buhler ..................... H03M 1/48
    341/118
5,206,647 A * 4/1993 Stone ..................... H03M 1/183
    341/139
(Continued)

FOREIGN PATENT DOCUMENTS

KR     10-2012-0030592 A     3/2012
KR     10-1783745 B1     10/2017
(Continued)

OTHER PUBLICATIONS

Young-Deuk Jeon et al., "A Dual-Channel Pipelined ADC With Sub-ADC Based on Flash-SAR Architecture", IEEE Transactions on Circuits and Systems—II: Express Briefs, 2012.
(Continued)

*Primary Examiner* — Linh V Nguyen
(74) *Attorney, Agent, or Firm* — LRK PATENT LAW FIRM

(57) ABSTRACT

A dynamic high-resolution ADC according to an example embodiment may include a dynamic amplifier configured to amplify, by as much as a first gain, the sampled-and-held analog signal received from the sample and hold circuit; DAC configured to convert a digital signal input from a decoder into an analog signal; a residue signal amplifier connected to the dynamic amplifier and the DAC and configured to calculate a difference between an output signal of the dynamic amplifier and an output signal of the DAC and amplify the difference by as much as a second gain; an ADC connected to the residue signal amplifier and configured to convert an output signal of the residue signal amplifier into a digital signal; and a decoder connected to the ADC and configured to decode, into digital data, an output signal of the ADC input by the ADC.

14 Claims, 9 Drawing Sheets

(58) Field of Classification Search
CPC ........ H03M 1/001; H03M 1/00; H03M 1/468; H03M 1/46; H03M 1/10; H03M 3/464; H03M 3/458; H03M 1/66; H03M 1/0607; H03M 1/1245; H03M 1/129; H03M 1/168
USPC .......................... 341/118–121, 139–140, 155
See application file for complete search history.

(56) References Cited

U.S. PATENT DOCUMENTS

| | | | | |
|---|---|---|---|---|
| 5,812,077 | A * | 9/1998 | Boie | H03M 1/1038 |
| | | | | 341/120 |
| 6,292,120 | B1 * | 9/2001 | Painchaud | H03M 1/185 |
| | | | | 341/139 |
| 6,340,945 | B1 * | 1/2002 | Hauptmann | H03M 3/474 |
| | | | | 341/172 |
| 6,774,941 | B1 * | 8/2004 | Boisvert | H04N 25/63 |
| | | | | 348/241 |
| 7,965,208 | B2 * | 6/2011 | McLoughlin | H04N 25/78 |
| | | | | 341/139 |
| 8,816,886 | B1 * | 8/2014 | Warner | H03M 1/1057 |
| | | | | 341/120 |
| 9,806,728 | B1 * | 10/2017 | Sugimoto | H03M 1/0602 |
| 10,826,520 | B1 | 11/2020 | Kumar Kundu et al. | |
| 2010/0033362 | A1 * | 2/2010 | Kitami | H04N 25/447 |
| | | | | 341/169 |
| 2015/0244389 | A1 * | 8/2015 | Lim | H03M 1/002 |
| | | | | 341/164 |
| 2016/0112057 | A1 | 4/2016 | Park | |
| 2018/0091107 | A1 * | 3/2018 | Matsuno | H03M 1/183 |
| 2020/0177195 | A1 | 6/2020 | Jeon et al. | |
| 2021/0266001 | A1 | 8/2021 | Kinyua et al. | |
| 2022/0006468 | A1 * | 1/2022 | Ishizuka | H03M 1/187 |

FOREIGN PATENT DOCUMENTS

| | | |
|---|---|---|
| KR | 10-2052728 B1 | 1/2020 |
| KR | 10-2020-0050357 A | 5/2020 |
| KR | 10-2180180 B1 | 11/2020 |

OTHER PUBLICATIONS

Syed Alireza Zahrai et al., "Review of Analog-To-Digital Conversion Characteristics and Design Considerations for the Creation of Power-Efficient Hybrid Data Converters", Journal of Low Power Electronics and Applications, 2018.

* cited by examiner

DYNAMIC HIGH-RESOLUTION ANALOG TO DIGITAL CONVERTER AND OPERATING METHOD THEREOF

CROSS-REFERENCE TO RELATED APPLICATIONS

This application claims the benefit of Korean Patent Application No. 10-2021-0148160 filed on Nov. 1, 2021, and Korean Patent Application No. 10-2022-0112593, filed on Sep. 6, 2022, in the Korean Intellectual Property Office, the entire disclosure of which is incorporated herein by reference for all purposes.

BACKGROUND

1. Field of the Invention

One or more example embodiments relate to a dynamic high-resolution analog to digital converter (ADC) and an operating method thereof.

2. Description of Related Art

A digital sensor is a device for measuring energy or a physical quantity as digital data. The digital sensor may include a sensor that converts a physical quantity into an electrical signal and an analog to digital converter (ADC) that converts an electrical signal that is an analog signal into digital data. The digital sensor may sense energy or a physical quantity in measurable units indicating a signal magnitude, such as temperature, voltage, or meter. The sensor may sense the physical quantity in a wide range of sizes from less than pico $10^{-12}$ to tera $10^{12}$ and above. Accordingly, there is a need for a high-resolution ADC to convert a wide range of physical quantities into accurate digital data.

SUMMARY

Example embodiments provide a dynamic high-resolution analog to digital converter and method of operating the same for a high-resolution digital sensor in order to improve a dynamic range of a digital sensor and resolution.

According to an aspect, there is provided a dynamic high-resolution analog to digital converter (ADC) including a sample and hold circuit configured to receive an analog signal from a sensor, sample the analog signal in units of time, and hold a size of the analog signal during a sampling period; a dynamic amplifier connected to the sample and hold circuit and configured to amplify, by as much as a first gain, the sampled-and-held analog signal received from the sample and hold circuit; a digital to analog converter (DAC) configured to convert a digital signal input from a decoder into an analog signal; a residue signal amplifier connected to the dynamic amplifier and the DAC and configured to calculate a difference between an output signal of the dynamic amplifier and an output signal of the DAC and amplify the difference by as much as a second gain; an analog to digital converter (ADC) connected to the residue signal amplifier and configured to convert an output signal of the residue signal amplifier into a digital signal; and a decoder connected to the ADC and configured to decode, into digital data, an output signal of the ADC input by the ADC.

The first gain may be initialized to an initial value for every sampling period and be reduced by a factor of ½ from the initial value whenever clipping occurs since an input signal of the ADC exceeds a range of an input signal that the ADC may receive.

The decoder may control the first gain to be reduced by a factor of ½ from the initial value of the first gain whenever clipping occurs since an input signal of the ADC exceeds a range of an input signal that the ADC may receive.

The second gain may have an initial value of 1 and be initialized to 1 for every sampling period and be determined to be an output of the ADC at the time of no occurrence of clipping, where the clipping does not occur since an input signal of the ADC is within a range of an input signal that the ADC may receive.

The decoder may be configured to control the second gain to be determined to be an output of the ADC at the time of no occurrence of clipping, where the clipping does not occur since an input signal of the ADC is within a range of an input signal that the ADC may receive.

The DAC may be configured to have an output initial value of 0 and be initialized to an initial value for every sampling period and receive the output signal of the ADC input by the decoder and convert the output signal of the ADC into an analog signal.

The decoder may be configured to control a first gain of the dynamic amplifier and a second gain of the residue signal amplifier and decode a digital signal into the digital data, based on the output signal of the ADC when the second gain is 1 and the output signal of the ADC when the second gain is not 1.

According to an aspect, there is provided a method of converting analog to digital by a dynamic high-resolution ADC, the method including performing sampling and holding operation, in which a sample and hold circuit receiving an analog signal from a sensor samples the analog signal and holds a size of the analog signal during a sampling period; performing a conversion operation of obtaining a first digital signal, in which a dynamic amplifier receiving the sampled-and-held analog signal from the sample and hold circuit amplifies a size of the sampled-and-held analog signal, and the sampled-and-held analog signal with the amplified size is converted into the first digital signal by a residue signal amplifier, which is configured to amplify a difference between two signals connected to and input by the dynamic amplifier and a digital to analog converter (DAC), and by an ADC, which is connected to the residue signal amplifier; performing a conversion operation of obtaining a second digital signal, in which the ADC converts a signal not converted into the first digital signal among the sampled-and-held analog signal into a second digital signal; and performing a decoding operation, in which a decoder connected to the ADC decodes the analog signal into digital data based on the first digital signal and the second digital signal.

The first digital signal may be a signal, in which the sampled-and-held analog signal is controlled within a range of an input signal that the ADC may receive, and the controlled sampled-and-held analog signal may be converted into a digital signal.

The performing of the conversion operation of obtaining the first digital signal may include operation A determining whether an output signal of the ADC, to which the sampled-and-held analog signal is input, is a maximum output signal of the ADC, based on a first gain of the dynamic amplifier and a second gain of the residue signal amplifier; operation B controlling the first gain to be ½ of the current first gain, where an output signal of the ADC, to which the sampled-and-held analog signal is input, is a maximum output signal of the ADC; operation C determining whether a number of loops is less than a maximum number of extension bits; and operation D, in which the ADC converts the sampled-and-held analog signal into the first digital signal, based on a controlled first gain, the maximum number of extension bits, and the second gain, where the number of loops is the maximum number of extension bits.

The method may further include operation E determining the number of extension bits to be the number of loops and controlling the second gain with the first digital signal, where the output signal of the ADC, to which the sampled-and-held analog signal is input, is less than the maximum output signal of the ADC.

The method may further include operation F increasing the number of loops by 1 and repeating operations A to D, where the number of loops is less than the maximum number of extension bits.

The first gain may be initialized to an initial value for every sampling period, and the second gain may have an initial value of 1 and be initialized for every sampling period.

The performing of the conversion operation of obtaining the second digital signal may include amplifying, by as much as a second gain, a difference between the sampled-and-held analog signal amplified by the dynamic amplifier and a first digital signal converted into an analog signal by the DAC and converting the amplified signal into a second digital signal by the ADC.

Additional aspects of example embodiments will be set forth in part in the description which follows and, in part, will be apparent from the description, or may be learned by practice of the disclosure.

According to example embodiments, a dynamic high-resolution ADC may improve a dynamic range of a digital sensor and resolution.

According to an example embodiment of the present disclosure, a method of operating a dynamic high-resolution ADC may improve a dynamic range of a digital sensor and resolution.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Figure 1:
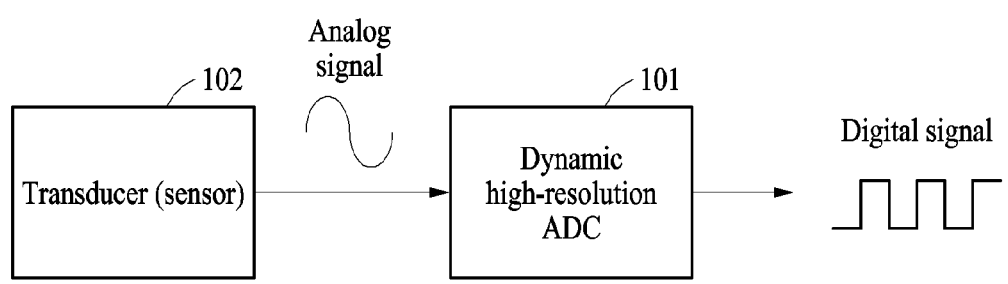
FIG. 1 illustrates a digital sensor according to an example embodiment.

Hereinafter, examples will be described in detail with reference to the accompanying drawings. The scope of the right, however, should not be construed as limited to the example embodiments set forth herein. In the drawings, like reference numerals are used for like elements.

Various modifications may be made to the examples. Here, the examples are not construed as limited to the disclosure and should be understood to include all changes, equivalents, and replacements within the idea and the technical scope of the disclosure.

Although terms of "first" or "second" are used to explain various components, the components are not limited to the terms. These terms should be used only to distinguish one component from another component. For example, a first component may be referred to as a second component, and similarly the second component may also be referred to as the first component.

The terminology used herein is for the purpose of describing particular examples only and is not to be limiting of the examples. As used herein, the singular forms "a", "an", and "the" are intended to include the plural forms as well, unless the context clearly indicates otherwise. As used herein, "A or B", "at least one of A and B", "at least one of A or B", "A, B or C", "at least one of A, B and C", and "at least one of A, B, or C," each of which may include any one of the items listed together in the corresponding one of the phrases, or all possible combinations thereof. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Unless otherwise defined, all terms including technical and scientific terms used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

When describing the examples with reference to the accompanying drawings, like reference numerals refer to like constituent elements and a repeated description related thereto will be omitted. In the description of example embodiments, detailed description of well-known related structures or functions will be omitted when it is deemed that such description will cause ambiguous interpretation of the present disclosure.

Hereinafter, example embodiments will be described in detail with reference to the accompanying drawings.

FIG. 1 illustrates a digital sensor according to an example embodiment.

Referring to FIG. 1, a dynamic high-resolution analog to digital converter (ADC) 101 and a transducer 102 are shown. The dynamic high-resolution ADC 101 and the transducer 102 may be included in a digital sensor.

The transducer 102 may measure a physical quantity. The transducer 102 may measure a physical quantity, such as a temperature, a pressure, and a voltage. The physical quantity measured by the transducer 102 may be an analog signal that is a continuous signal. In order for the analog signal measured by the transducer 102 to be processed and stored in an electronic device, an ADC may convert the analog signal into a digital signal or digital data that is a discrete signal.

The dynamic high-resolution ADC 101 may receive the analog signal measured by the transducer 102. The dynamic high-resolution ADC 101 may convert an analog signal, which is a continuous signal, into a digital signal, which is a discrete signal. A dynamic range or a full scale indicating a range of signals that may be normally converted and resolution indicating the accuracy of a measured value may matter to the dynamic high-resolution ADC 101.

The resolution may include a temporal resolution and a size resolution. The temporal resolution may be related to a sample per second (SPS) indicating a speed at which an analog signal is converted into a digital signal. Herein, the resolution may refer to the size resolution. The ADC may be required to increase a signal to noise ratio (SNR) to improve the dynamic range and the resolution. The SNR of the ADC may be proportional to the effective number of bits (ENOB) representing a digital value. The number of ENOB in the ADC may need to be great enough to increase the SNR. Accordingly, an input signal of the ADC may need to be dynamically matched with the size of a full scale range (FSR) of the ADC.

The ADC may include a flash ADC, a successive approximation register (SAR) ADC, a pipeline ADC, and a sigma delta ADC. The flash ADC may include a comparator, which samples an input voltage and compares the input voltage to a reference voltage, and a decoder, which converts a digital signal to digital data. The flash ADC may improve the dynamic range and the resolution according to an increase in the number of bits but may increase complexity as the number of comparators increases proportionally to the power of two. The SAR ADC, the pipeline ADC, and the sigma delta ADC may be used to improve the complexity of the flash ADC in implementation.

The SAR ADC may repeat one unit ADC as many as the number of bits according to a clock and decode the one unit ADC. The unit ADC may include a sampling and hold amplifier (SHA), a comparator, a digital to analog converter, a subtractor, and an amplifier. The SAR ADC may repeat one unit ADC from a most significant bit (MSB) by as many as the number of bits.

The pipeline ADC may increase the number of bits and reduce ADC complexity by serially connecting a plurality of sub-range ADCs. For example, the pipeline ADC may use an 8-bit subrange ADC and a 4-bit subrange ADC to provide a 12-bit ADC. The sigma delta ADC may convert an analog signal to a digital signal in a delta manner.

Since the transducer 102 needs to measure a physical quantity in a measurement unit, the transmitter 102 may not use an automatic gain control (AGC) that greatly amplifies a small signal and amplifies a large signal to be small in order to improve resolution.

Described hereinafter in detail is a dynamic high-resolution ADC for a high-resolution digital sensor that may increase a dynamic range and resolution of a digital sensor.

Figure 2:
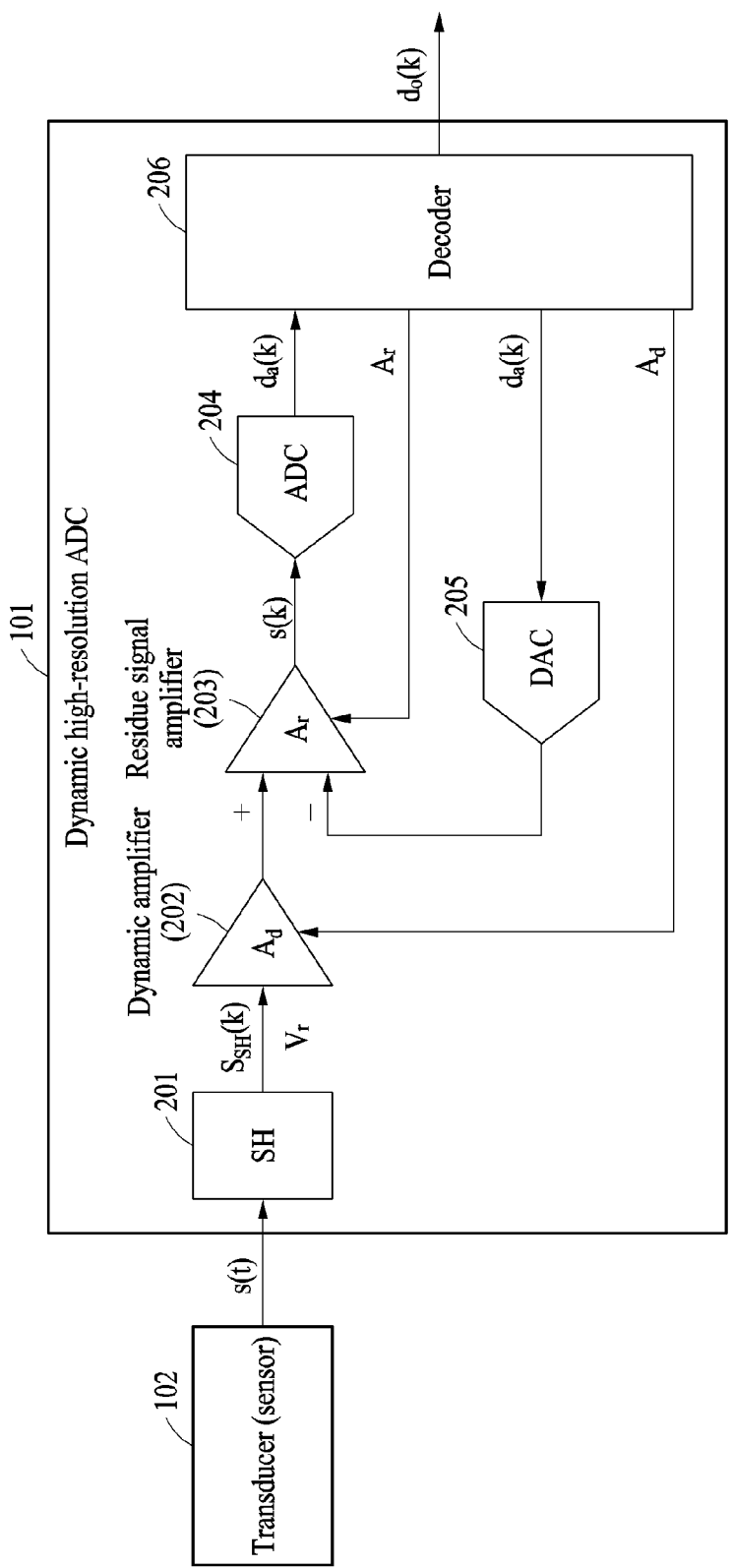
FIG. 2 is a block diagram illustrating a digital sensor according to an example embodiment.

FIG. 2 is a block diagram illustrating a digital sensor according to an example embodiment.

Referring to FIG. 2, a transducer 102 and a dynamic high-resolution ADC 101 are shown. A digital sensor may include the transducer 102 and the dynamic high-resolution ADC 101.

The transducer 102 may convert a physical quantity into an electrical signal. The transducer 102 may convert a physical quantity, such as temperature, solar radiation, and a voltage, into an electrical signal. The electrical signal converted by the transducer 102 may be an analog signal. In order for an electronic device to process and store an analog signal, the analog signal may need to be converted into a digital signal or digital data. The dynamic high-resolution ADC 101 may convert the analog signal received from the transducer 102 into digital data.

The dynamic high-resolution ADC 101 may include a sample and hold circuit 201, a dynamic amplifier 202, a residue signal amplifier 203, and an ADC 204, a digital to analog converter (DAC) 205, and a decoder 206.

The sample and hold circuit 201 may sample the analog signal received from the transducer 102 in units of time. The sample and hold circuit 201 may hold the magnitude of the analog signal sampled in units of time during a sampling period.

The dynamic amplifier 202 may be connected to the sample and hold circuit 201. The dynamic amplifier 202 may amplify, by as much as $A_d$, the sampled-and-held analog signal, received from the sample and hold circuit. $A_d$ may be a gain of the dynamic amplifier 202. $A_d$ may be a first gain of the dynamic high-resolution ADC 101. Where an output signal received by the ADC 204 exceeds a range of an input signal that the ADC 204 may receive, the gain $A_d$ of the dynamic amplifier 202 may reduce by a factor of ½. The gain $A_d$ of the dynamic amplifier 202 may reduce by a factor of ½ until the output signal received by the ADC 204 is within the range of an input signal that the ADC 204 may receive. That is, where the output signal received by the ADC 204 exceeds the range of an input signal that the ADC 204 may receive so clipping occurs in which a part of the output of the ADC 204 is cut off, the gain $A_d$ of the dynamic amplifier 202 may reduce by a factor of ½ until the clipping does not occur. $A_d$ may be initialized to an initial value for each sampling period. Such a process may increase the ENOB by dynamically matching the input signal of the ADC 204 to the FSR of the ADC 204 to improve a noise figure.

The residue signal amplifier 203 may be connected to the dynamic amplifier 202 and the DAC 205. The residue signal amplifier 203 may calculate a difference between an output signal of the dynamic amplifier 202 and an output signal of the DAC 205. The residue signal amplifier 203 may amplify, by as much as $A_r$, the difference between the output signal of the dynamic amplifier 202 and the output signal of the DAC 205. $A_r$ may be a gain of the residue signal amplifier 203. $A_r$ may be a second gain of the dynamic high-resolution ADC 101. An initial value of $A_r$ may be set to 1. Where the output signal received by the ADC 204 does not exceed a range of an input signal that the ADC 204 may receive, the gain $A_r$ of the residue signal amplifier 203 may be set to be equal to the output of the ADC 204. $A_r$ may be initialized to the initial value of 1 for each sampling period.

The ADC 204 may be connected to the residue signal amplifier 203. The ADC 204 may convert an analog signal into a digital signal. The ADC 204 may convert the output signal received from the residue signal amplifier 203 into a digital signal. Where the output signal received by the ADC 204 exceeds a range of an input signal that the ADC 204 may receive, the gain $A_d$ of the dynamic amplifier 202 may reduce by a factor of ½. The gain $A_d$ of the dynamic amplifier 202 may reduce by a factor of ½ until the output signal received by the ADC 204 is within the range of an input signal that the ADC 204 may receive. That is, where the output signal received by the ADC 204 exceeds the range of an input signal that the ADC 204 may receive so clipping occurs in which a part of the output of the ADC 204 is cut off, the gain $A_d$ of the dynamic amplifier 202 may reduce by a factor of ½ until the clipping does not occur. The ADC 204 may not be limited to a cyclic ADC, a pipeline ADC, and the like, and various structures of the ADC 204 may be used.

The DAC 205 may be connected to the decoder 206. The DAC 205 may convert a digital signal into an analog signal. The DAC 205 may convert the digital signal received from the decoder 206 into an analog signal. An output initial value of the DAC 205 may be 0 and may be initialized to 0 for every sampling period.

The decoder 206 may be connected to the ADC 204. The decoder 206 may decode, into digital data, the output signal received from the ADC 204 as an input. The decoder 206 may control the dynamic amplifier 202 and the residue signal amplifier 203. Specifically, the decoder 206 may control the gains of the dynamic amplifier 202 and the residue signal amplifier 203. The decoder 206 may control the gain $A_d$ of the dynamic amplifier 202 to be reduced by a factor of ½ until the input signal of the ADC 204 is within the range of an input signal that the ADC 204 may receive so that clipping does not occur where a part of the output signal of the ADC 204 is cut off.

The decoder 206 may set, to the gain $A_r$ of the residue signal amplifier 203, the output of the ADC 204 when the clipping, in which a part of the output signal of the ADC 204 is cut off, does not occur since the input signal of the ADC 204 is within the range of an input signal that the ADC 204 may receive. As a result, the decoder 206 may control the output of the ADC 204 and the input of the DAC 205.

Described hereinafter is a method of converting analog to digital by a dynamic high-resolution ADC.

Figure 3:
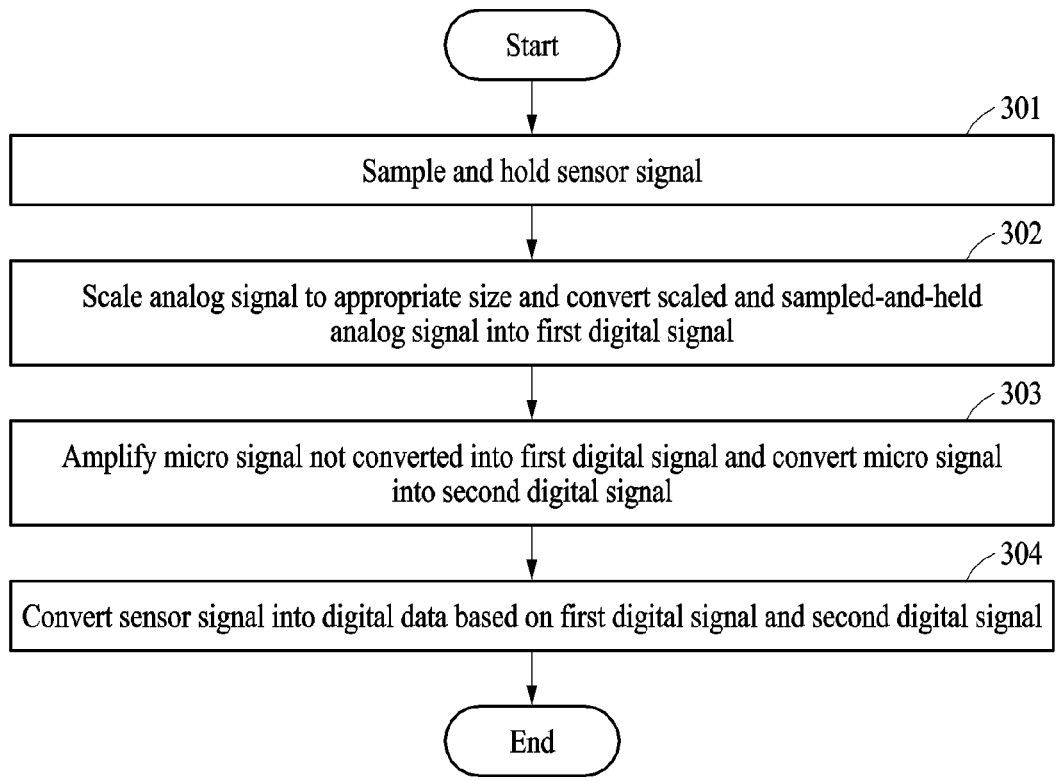
FIG. 3 is a flowchart of converting an analog signal into digital data, according to an example embodiment.

FIG. 3 is a flowchart of converting an analog signal into digital data, according to an example embodiment.

In operation 301, a dynamic high-resolution ADC 101 may sample and hold a sensor signal received from a sensor. Specifically, a sample and hold circuit 201 included in the dynamic high-resolution ADC 101 may sample the sensor signal received from the sensor in units of time to hold the size of the sensor signal during a sampling period. The sensor signal may be an analog signal.

In operation 302, the dynamic high-resolution ADC 101 may scale the analog signal to an appropriate size and convert the scaled and sampled-and-held analog signal to a first digital signal. Specifically, a dynamic amplifier 202 may scale the analog signal to an appropriate size and an ADC 204 may convert the scaled and sampled-and-held analog signal into the first digital signal. The scaled and sampled—and held analog signal may be within a range of an input signal that the ADC 204 may receive. Clipping may not occur where a part of the signal is cut off for the digital signal, into which the ADC 204 converts the scaled and sampled—and held signal as an input.

In operation 303, the dynamic high-resolution ADC 101 may amplify a micro signal not converted into a first digital signal and convert the micro signal into a second digital signal. Specifically, a residue signal amplifier 203 may amplify a difference between an output signal of the dynamic amplifier 202 and an output signal of the DAC 205. The difference between the output signal of the dynamic amplifier 202 and the output signal of the DAC 205 may be the micro signal of the analog signal not converted into the first digital signal. The ADC 204 may convert, into the second digital signal, the amplified difference between the output signal of the dynamic amplifier 202 and the output signal of the DAC 205.

In operation 304, the dynamic high-resolution ADC 101 may convert a sensor signal into digital data, based on the first digital signal and the second digital signal. Specifically, a decoder 206 may convert the sensor signal, which is an analog signal, into digital data, based on the first digital signal of operation 302 and the second digital signal of operation 303.

Hereinafter, a dynamic ADC (DADC) corresponding to operation 302 is described.

Figure 4:
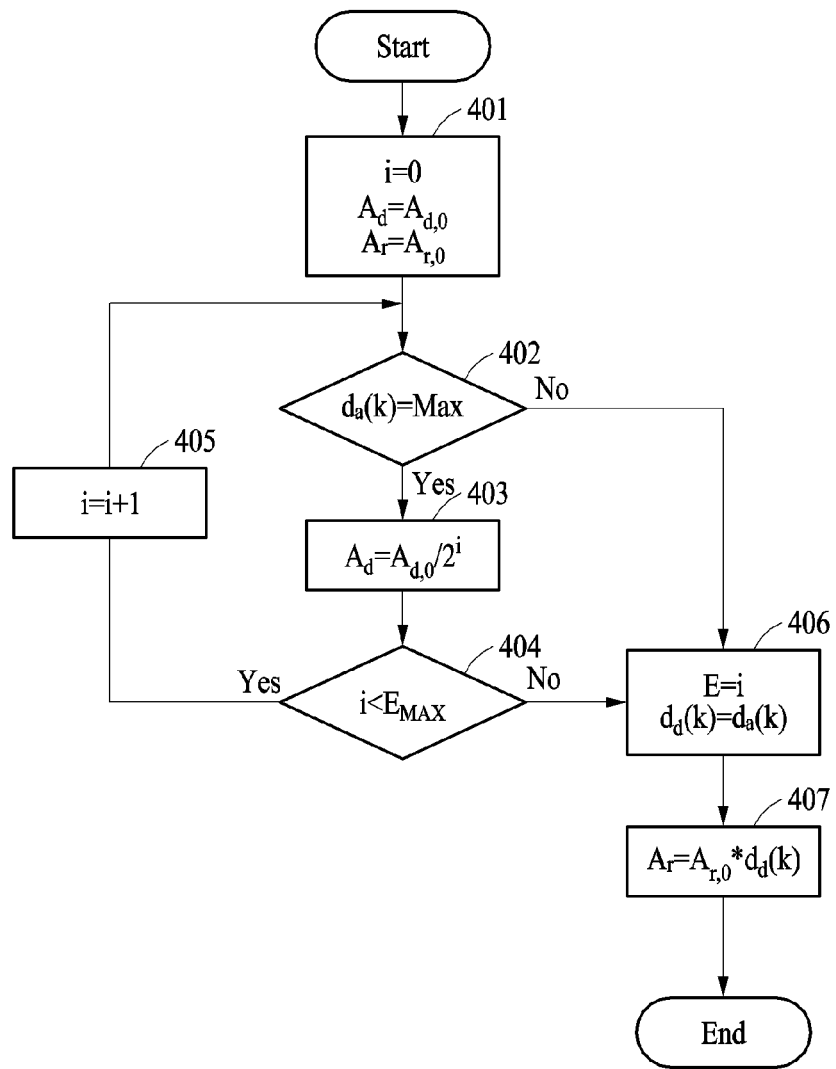
FIG. 4 is a flowchart illustrating a dynamic analog to digital converter (DADC) operation according to an example embodiment.

FIG. 4 is a flowchart illustrating a DADC operation according to an example embodiment.

In operation 401, where clipping occurs in an ADC 204, a decoder 206 may control a gain $A_d$ of a dynamic amplifier 202 to be repeatedly reduced by a factor of ½ until the clipping does not occur. In this case, where the number of repetition is i, i may refer to the number of loops. For example, where the clipping occurs in the ADC 204 and the gain $A_d$ reduces by 3 times to ⅛ until the clipping does not occur, i may be 3. The initial value of i may be 0. $A_d$ may be a gain of the dynamic amplifier 202. The initial value of $A_d$ may be $A_{d,0}$. $A_r$ may be a gain of a residue signal amplifier 203. The initial value of $A_r$ may be 1 as $A_{r,0}$. i, $A_d$, and $A_r$ may be initialized to initial values for each sampling period.

In operation 402, the dynamic high-resolution ADC 101 may determine whether $d_a(k)$, which is an output of the ADC 204, is a maximum. Whether $d_a(k)$ is a maximum may be determined by whether all output bits of the ADC 204 are used. For example, where the output bits of the ADC 204 are 8 bits and $d_a(k)$ is "11111111", the output bits of $d_a(k)$ may be all used and thus be a maximum. Where the $d_a(k)$ is a maximum, a signal input to the ADC 204 exceeds a range of an input signal that the ADC 204 may receive and there may be clipping in which a part of the output is cut off. Thus, where $d_a(k)$ is a maximum, the dynamic high-resolution ADC 101 may perform operation 403 for controlling the gain $A_d$ of the dynamic amplifier 202. Where $d_a(k)$ is not a maximum, no clipping has occurred, so the dynamic high-resolution ADC 101 may perform operation 406.

In operation 403, the dynamic high-resolution ADC 101 may control the gain $A_d$ of the dynamic amplifier 202 to be $(½)^i$ times an initial value. The decoder 206 of the dynamic high-resolution ADC 101 may control the gain $A_d$ of the dynamic amplifier 202 to be $(½)^i$ times the initial value. That is, whenever clipping occurs, the decoder 206 may control the gain $A_d$ by ½ times the initial value. When the gain $A_d$ reduces, the signal input to the ADC 204 may be controlled to be within the range of an input signal that the ADC 204 may receive.

In operation 404, the dynamic high-resolution ADC 101 may determine whether i is less than $E_{MAX}$. $E_{MAX}$ may refer to the maximum number of extension bits. Where i is greater than or equal to $E_{MAX}$, operation 406 may be performed. Where i is less than $E_{MAX}$, operation 405 may be performed.

In operation 405, the dynamic high-resolution ADC 101 may repeat operations 402 to 404 by adding 1 to the current i. Specifically, the decoder 206 may add 1 to i and perform operations 402 and 403 to control the first gain $A_d$.

In operation 406, the dynamic high-resolution ADC 101 may determine the number of extension bits E to be i, which is the number of loops. Since $d_a(k)$ is not a maximum, the dynamic high-resolution ADC 101 may determine a first digital signal $d_d(k)$, into which the ADC 101 converts a sampled-and-held analog signal, to be $d_a(k)$, which is the output of the ADC 204. In the DADC operation, since the second gain $A_r$ is maintained at 1, the first digital signal may be the output signal of the ADC 204 when the second gain is 1.

In operation 407, the dynamic high-resolution ADC 101 may determine $A_r$, which is a gain of the residue signal amplifier 203, to be equal to $A_{r,0}*d_d(k)$. Since $A_{r,0}$ is 1, $A_r$ may be determined by $d_d(k)$, which is the first digital signal. $A_r$ may be controlled to become $d_d(k)$, which is the first digital signal. The decoder 206 may control $A_r$ to become $d_d(k)$, which is the first digital signal.

Hereinafter, a residue ADC (RADC) operation corresponding to operation 303 of FIG. 3 is described.

Figure 5:
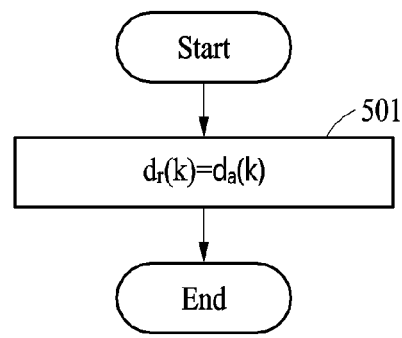
FIG. 5 is a flowchart illustrating a residue analog to digital converter (RADC) operation according to an example embodiment.

FIG. 5 is a flowchart illustrating an RADC operation according to an example embodiment.

In operation 501, a dynamic high-resolution ADC 101 may convert a second digital signal that is an output of the RADC operation. The second digital signal may be $d_r(k)$. The second digital signal $d_r(k)$ may be determined by $d_d(k)$ that is an output of the ADC 204. $d_d(k)$ of FIG. 5 may be a signal obtained by amplifying a difference between an output signal of a dynamic amplifier 202 and an output signal of a DAC 205 by as much as a gain $A_r$ of a residue signal amplifier 203 determined in the DADC operation of FIG. 4 and by the ADC 204 converting the signal into a digital signal. Since $A_r$, which is a second gain, is controlled to be $d_d(k)$ in the DADC operation, the second digital signal $d_r(k)$ may be an output signal of the ADC 204 when the second gain is not 1.

In this case, the difference between the output signal of the dynamic amplifier 202 and the output signal of the DAC 205 may be an analog signal not converted into a digital signal in the DADC operation. The difference between the output signal of the dynamic amplifier 203 and the output signal of the DAC 205 may be a micro signal not converted into a digital signal in the DADC operation. Accordingly, the second digital signal $d_r(k)$ may be a signal obtained by converting, into a digital signal, a sampled-and-held analog signal not converted into the first digital signal in the DADC operation.

Described hereinafter in detail is a method of converting, into digital data, an analog signal received from a sensor based on the first digital signal $d_d(k)$, which is the output of the DADC operation, and the second digital signal $d_r(k)$, which is the output of the RADC operation.

Figure 6:
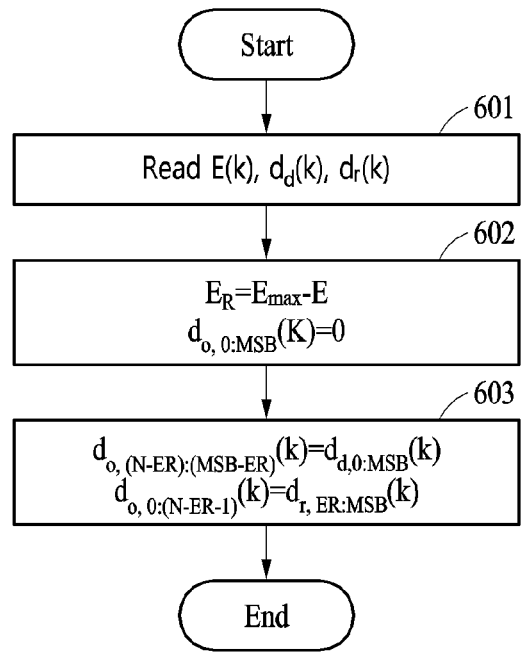
FIG. 6 is a flowchart illustrating a method in which a decoder decodes a digital signal, according to an example embodiment.

FIG. 6 is a flowchart illustrating a method in which a decoder decodes a digital signal according to an example embodiment.

In operation 601, a dynamic high-resolution ADC 101 may read E, $d_d(k)$, and $d_r(k)$ determined in the previous DADC operation and RADC operation. Specifically, a decoder 206 may read E, $d_d(k)$, and $d_r(k)$ determined in the previous DADC and RADC operations. The decoder 206 may decode a digital signal into digital data based on E, $d_d(k)$, and $d_r(k)$.

In operation 602, the dynamic high-resolution ADC 101 may determine ER, which is the number of residual extension bits, to be $E_R=E_{MAX}-E$. Specifically, the decoder 206 may determine ER, which is the number of residual extension bits, by a difference between $E_{MAX}$, which is the maximum number of extension bits, and E. The decoder 206 may determine $d_{o,0:MSB}(k)$ to be 0. $d_{o,0:MSB}(k)$ may be an initial digital data output for a kth sampling value of the decoder 206 and be determined to be 0 for bits from the least significant bit (LSB) to the most significant bit (MSB) of the initial digital data output. That is, $d_{o,0:MSB}(k)$ may be determined to be 0 since it is before decoding of the decoder 206. In operation 603, the output of the decoder 206 may be determined as follows.

$$d_{o,(N-ER):(MSB-ER)}(k)d_{d,0:MSB}(k) \quad (1)$$

$$d_{o,0:(N-ER-1)}(k)=d_{r,ER:MSB}(k) \quad (2)$$

That is, MSB-$E_R$ to N-$E_R$ among the output bits of the decoder 206 may be decoded values of the first digital signal $d_d(k)$. Also, N-$E_R$-1 to LSB $d_{o,0}$ among the output bits of the decoder 206 may be decoded values from the MSB to ER of the second digital signal $d_r(k)$. In this case, N may be the number of bits of the ADC 204. N may be the number of output bits of the ADC 204. That is, the ADC 204 may be the number of bits of the first digital signal and the second digital signal. According to an example embodiment, N may be 8 since the number of output bits of the first digital signal and the second digital signal, which are the outputs of the ADC 204, is 8.

Accordingly, referring to FIG. 6, the input signal of the amplifier may be controlled to an appropriate level in the DADC operation by using the number of extension bits E. In this case, the ENOB may be increased to improve a dynamic range and resolution. For example, when the ADC 204 is 8 bits and the number of maximum extension bits is 4 bits, the output bits of the dynamic high-resolution ADC 101 may be up to 16. Accordingly, the dynamic high-resolution ADC 101 may measure a physical quantity up to $2^{16}$ (65,536) level.

Hereinafter, a method in which a decoder decodes a digital signal is described with an example.

Figure 7A:
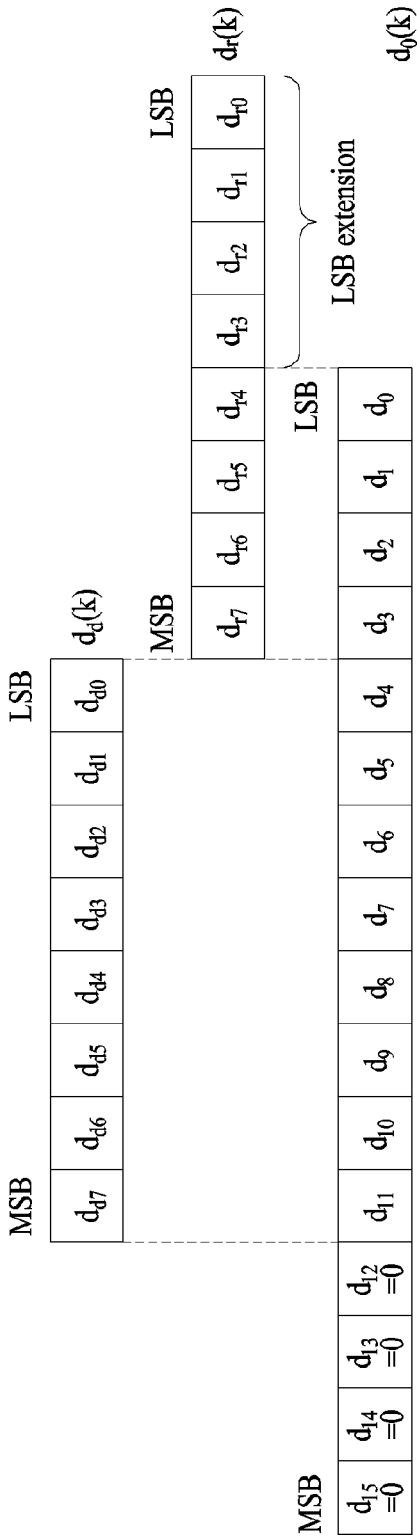
FIG. 7A to 7C are examples illustrating a method in which a decoder decodes a digital signal, according to an example embodiment.
Figure 7B:
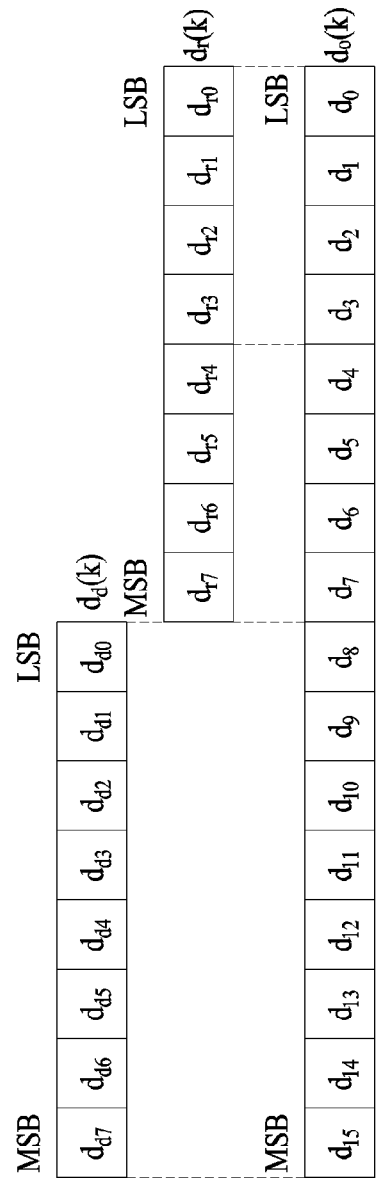
Figure 7C:
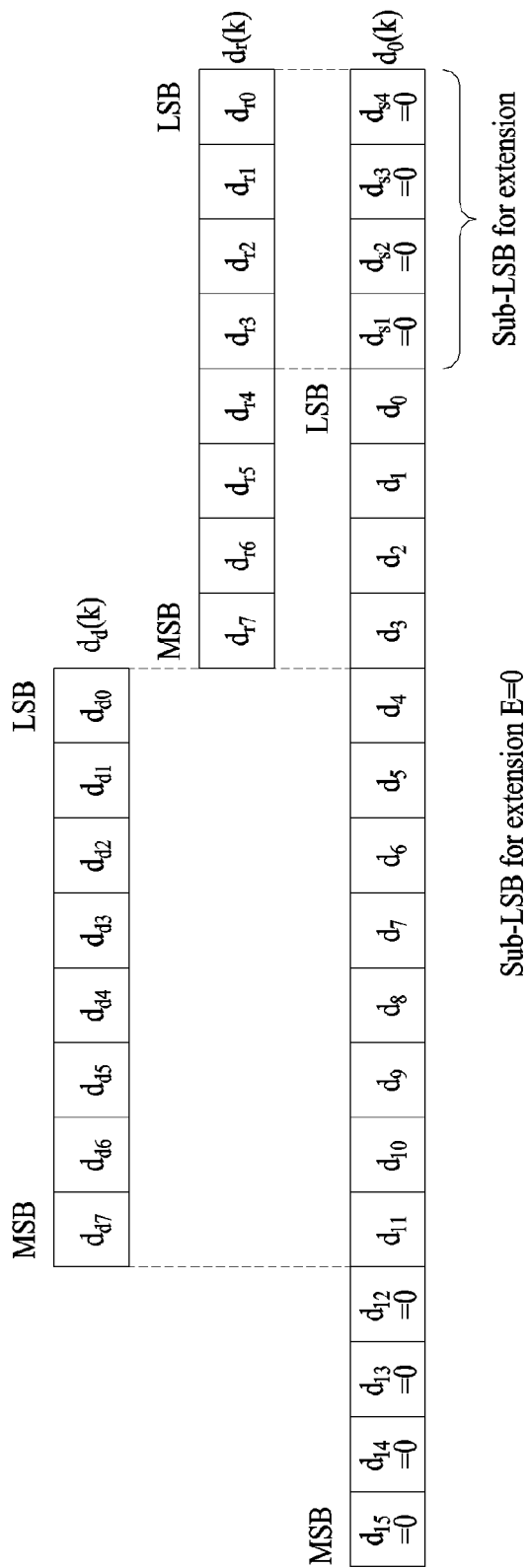

FIG. 7A to 7C are examples illustrating a method in which a decoder decodes a digital signal, according to an example embodiment.

Hereinafter, it is assumed that $E_{MAX}=4$ and the number of bits of the ADC 204 is 8 bits. Accordingly, the first digital signal $d_d(k)$ and the second digital signal $d_r(k)$ may be 8 bits. However, the foregoing is only an example and may not be limited thereto. $d_{o,n}$, which is a bit of output digital data of a decoder 206, is denoted as do in FIG. 7A to 7C for convenience. For example, $d_{o,15}$, which is the MSB among bits of the output digital data of the decoder 206, may be referred to as $d_{15}$ for convenience.

FIG. 7A is a diagram illustrating a method in which the decoder 206 decodes $d_d(k)$ and $d_r(k)$ and converts the $d_d(k)$ and $d_r(k)$ into digital data where E=0. FIG. 7B is a diagram illustrating a method in which the decoder 206 decodes $d_d(k)$ and $d_r(k)$ and converts the $d_d(k)$ and $d_r(k)$ into digital data where E=4. FIG. 7C is a diagram illustrating a method in which the decoder 206 decodes $d_d(k)$ and $d_r(k)$ and converts the $d_d(k)$ and $d_r(k)$ into digital data where E=0 in a sub-LSB extension type.

Where the number of bits of an ADC 204 is N and the maximum number of extension bits is $E_{MAX}$, L, which is the number of bits of the decoded output digital data, may be $N+E_{MAX}$.

In FIG. 7A, it may be determined that $E_R=4$ since $E_{MAX}=4$ and E=0, according to operation 602 of FIG. 6. Since the number of bits of the ADC 204 is 8 bits, the decoder 206 may output up to 16 bits. Accordingly, the MSB of the output digital data of the decoder 206 may be determined to be $d_{15}$ and the LSB may be determined to be $d_0$. The MSBs of the first digital signal $d_d(k)$ and the second digital signal $d_r(k)$ may be determined to be $d_{d7}$ and $d_{r7}$, respectively.

Accordingly, referring to operation 603 of FIG. 6, $d_{11}$, which is $d_{15}$-4 of $d_o(k)$, to $d_4$, which is $d_{8-4}$, may be decoded as $d_{d7}$ to $d_{d0}$ of the first digital signal. Also, $d_3$, which is $d_{8-4-1}$ of $d_o(k)$, to $d_0$ may be decoded as $d_{r7}$ to $d_{r4}$ of the second digital signals. In this case, $d_{13}$, which exceeds $d_{12}$, to $d_{15}$, which is the MSB of $d_o(k)$, may be decoded as 0.

In FIG. 7B, it may be determined that $E_R=0$ since $E_{MAX}=4$ and E=4, according to operation 602 of FIG. 6. Since the number of bits of the ADC 204 is 8 bits, the decoder 206 may output up to 16 bits. Accordingly, the MSB of the output digital data of the decoder 206 may be determined to be $d_{15}$ and the LSB may be determined to be do. The MSBs of the first digital signal $d_d(k)$ and the second digital signal $d_r(k)$ may be determined to be $d_{d7}$ and $d_{r7}$, respectively.

Accordingly, referring to operation 603 of FIG. 6, $d_{15}$, which is $d_{15-0}$ of $d_o(k)$, to $d_8$, which is $d_{8-0}$, may be decoded as $d_{d7}$ to $d_{d0}$ of the first digital signals. Also, $d_7$, which is $d_{8-0-1}$ of $d_o(k)$, to $d_0$ may be decoded as $d_{r7}$ to $d_{r0}$ of the second digital signals.

FIG. 7C may be a sub-LSB extension type. Since E=0 in in FIG. 7C, the decoder 206 may decode a digital signal as shown in FIG. 7A. However, the decoder 206 may add a sub LSB for extension to the LSB of do.

Figure 8:
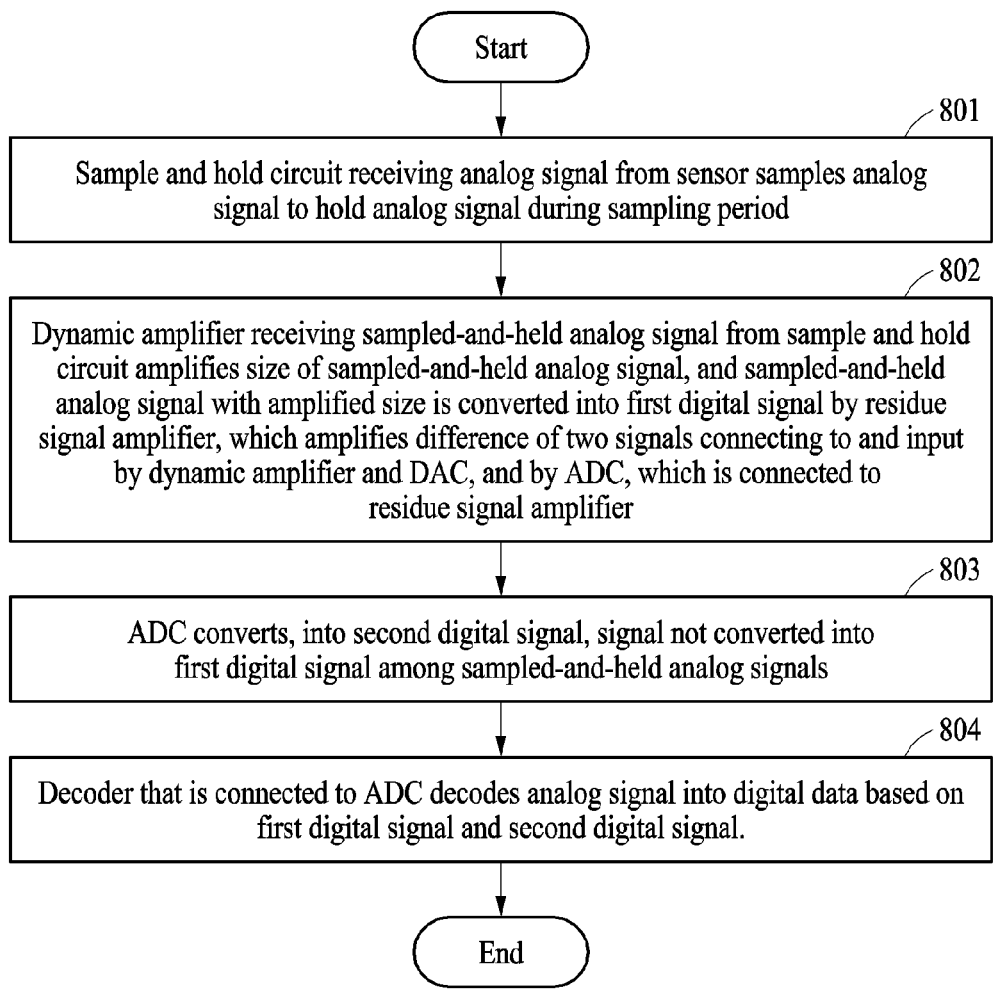
FIG. 8 is a diagram illustrating a method of converting analog to digital, according to an example embodiment.

FIG. 8 is a diagram illustrating analog-to-digital conversion according to an example embodiment.

According to an example embodiment, in operation 801, a sample and hold circuit 201 may receive an analog signal from a sensor, sample the received analog signal, and hold a size of the analog signal during a sampling period.

According to an example embodiment, in operation 802, a dynamic amplifier 202 receiving the sampled-and-held analog signal from the sample and hold circuit 201 may amplify the size of the sampled-and-held analog signal. A residue signal amplifier 203, which is connected to the dynamic amplifier 202 and a DAC 205 and amplifies a difference between two signals input by the dynamic amplifier 202 and the DAC 205, and an ADC 204, which is connected to the residue signal amplifier 203, may convert the amplified size of the sampled-and-held analog signal into a first digital signal.

According to an example embodiment, the first digital signal may refer to the sampled-and-held analog signal converted into a digital signal, wherein the sampled-and-held analog signal is controlled to be within the range of an input signal that the ADC 204 may receive and the controlled sampled-and-held signal is converted into the digital signal.

According to an example embodiment, operation 802 may further include operation A that determines whether the output signal of the ADC 204, to which the sampled-and-held analog signal is input, is the maximum output signal of the ADC 204, based on the first gain of the dynamic amplifier 202 and the second gain of the residual amplifier 203.

According to an example embodiment, where the output signal of the ADC 204, to which the sample-and-hold analog signal is input, is the maximum output signal of the ADC 204, operation 802 may further include B operation that controls the first gain to be ½ times the current first gain.

According to an example embodiment, operation 802 may further include operation C determining whether the number of loops is the maximum number of extension bits.

According to an example embodiment, where the number of loops is the maximum number of extension bits, operation 802 may further include operation D, in which the ADC 204 converts the sampled-and-held analog signal into the first digital signal, based on the controlled first gain, the maximum number of extension bits, and the second gain.

According to an example embodiment, in operation 802, the dynamic high-resolution ADC 101 may determine the number of extension bits to be the number of loops and further include operation E controlling the second gain with the first digital signal where the output signal of the ADC, to which the sampled-and-held analog signal is input, is less than the maximum output signal of the ADC.

According to an example embodiment, where the number of loops is less than the maximum number of extension bits, operation 802 may increase the number of loops by 1 and further include operation F repeating operations A to D.

According to an example embodiment, the first gain may be initialized to an initial value for every sampling period.

According to an example embodiment, the second gain may have an initial value of 1 and may be initialized to the initial value for every sampling period.

According to an example embodiment, in operation 803, the ADC 204 may convert, into the second digital signal, a signal not converted into the first digital signal among sampled-and-held analog signals.

According to an example embodiment, operation 803 may further include an operation amplifying, by as much as the second gain, a difference between the sampled-and-held analog signal amplified by the dynamic amplifier 202 and the first digital signal converted into the analog signal by the DAC 205.

According to an example embodiment, operation 803 may include an operation converting the signal amplified by the ADC 204 into the second digital signal.

According to an example embodiment, in operation 804, the decoder 206 may be connected to the ADC 204. The decoder 206 may decode the analog signal into digital data based on the first digital signal and the second digital signal.

The components described in the example embodiments may be implemented by hardware components including, for example, at least one digital signal processor (DSP), a processor, a controller, an application-specific integrated circuit (ASIC), a programmable logic element, such as a field programmable gate array (FPGA), other electronic devices, or combinations thereof. At least some of the functions or the processes described in the example embodiments may be implemented by software, and the software may be recorded on a recording medium. The components, the functions, and the processes described in the example embodiments may be implemented by a combination of hardware and software.

The method according to example embodiments may be written in a computer-executable program and may be implemented as various recording media such as magnetic storage media, optical reading media, or digital storage media.

Various techniques described herein may be implemented in digital electronic circuitry, computer hardware, firmware, software, or combinations thereof. The implementations may be achieved as a computer program product, i.e., a computer program tangibly embodied in an information carrier, e.g., in a machine-readable storage device (for example, a computer-readable medium) or in a propagated signal, for processing by, or to control an operation of, a data processing apparatus, e.g., a programmable processor, a computer, or multiple computers. A computer program, such as the computer program(s) described above, may be written in any form of a programming language, including compiled or interpreted languages, and may be deployed in any form, including as a stand-alone program or as a module, a component, a subroutine, or other units suitable for use in a computing environment. A computer program may be deployed to be processed on one computer or multiple computers at one site or distributed across multiple sites and interconnected by a communication network.

Processors suitable for processing of a computer program include, by way of example, both general and special purpose microprocessors, and any one or more processors of any kind of digital computer. Generally, a processor will receive instructions and data from a read-only memory or a random-access memory, or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Examples of information carriers suitable for embodying computer program instructions and data include semiconductive wire memory devices, e.g., magnetic media such as hard disks, floppy disks, and magnetic tape, optical media such as compact disk read only memory (CD-ROM) or digital video disks (DVDs), magneto-optical media such as floptical disks, read-only memory (ROM), random-access memory (RAM), flash memory, erasable programmable ROM (EPROM), or electrically erasable programmable ROM (EEPROM). The processor and the memory may be supplemented by, or incorporated in special purpose logic circuitry.

In addition, non-transitory computer-readable media may be any available media that may be accessed by a computer and may include both computer storage media and transmission media.

Although the present specification includes details of a plurality of specific example embodiments, the details should not be construed as limiting any invention or a scope that can be claimed, but rather should be construed as being descriptions of features that may be peculiar to specific example embodiments of specific inventions. Specific features described in the present specification in the context of individual example embodiments may be combined and implemented in a single example embodiment. On the contrary, various features described in the context of a single example embodiment may be implemented in a plurality of example embodiments individually or in any appropriate sub-combination. Furthermore, although features may operate in a specific combination and may be initially depicted as being claimed, one or more features of a claimed combination may be excluded from the combination in some cases, and the claimed combination may be changed into a sub-combination or a modification of the sub-combination.

Likewise, although operations are depicted in a specific order in the drawings, it should not be understood that the operations must be performed in the depicted specific order or sequential order or all the shown operations must be performed in order to obtain a preferred result. In specific cases, multitasking and parallel processing may be advantageous. In addition, it should not be understood that the separation of various device components of the aforementioned example embodiments is required for all the example embodiments, and it should be understood that the aforementioned program components and apparatuses may be integrated into a single software product or packaged into multiple software products.

The example embodiments disclosed in the present specification and the drawings are intended merely to present specific examples in order to aid in understanding of the present disclosure, but are not intended to limit the scope of the present disclosure. It will be apparent to those skilled in the art that various modifications based on the technical spirit to of the present disclosure, as well as the disclosed example embodiments, can be made.

What is claimed is:

1. A dynamic high-resolution analog to digital converter (ADC) comprising:
   a sample and hold circuit configured to receive an analog signal from a sensor, sample the analog signal in units of time, and hold a size of the analog signal during a sampling period;
   a dynamic amplifier connected to the sample and hold circuit and configured to amplify, by as much as a first gain, the sampled-and-held analog signal received from the sample and hold circuit;
   a digital to analog converter (DAC) configured to convert a digital signal input from a decoder into an analog signal;
   a residue signal amplifier connected at one input thereof to the dynamic amplifier and at another input thereof to the DAC and configured to calculate a difference between an output signal of the dynamic amplifier and an output signal of the DAC and amplify the difference by as much as a second gain;
   an analog to digital converter (ADC) connected to the residue signal amplifier and configured to convert an output signal of the residue signal amplifier into a digital signal; and
   the decoder connected to the ADC and configured to decode, into digital data, an output signal of the ADC input by the ADC,
   wherein the decoder is connected to the dynamic amplifier and controls the first gain of the dynamic amplifier, and is connected to the residual signal amplifier and controls the second gain of the residue signal amplifier.

2. The dynamic high-resolution ADC of claim 1, wherein the first gain is initialized to an initial value for every sampling period and is reduced by a factor of ½ from the initial value whenever clipping occurs since an input signal of the ADC exceeds a range of an input signal that the ADC is able to receive.

3. The dynamic high-resolution ADC of claim 1, wherein the decoder controls the first gain to be reduced by a factor of ½ from the initial value of the first gain whenever clipping occurs since an input signal of the ADC exceeds a range of an input signal that the ADC is able to receive.

4. The dynamic high-resolution ADC of claim 1, wherein the second gain:
   has an initial value of 1 and is initialized to 1 for every sampling period; and
   is determined to be an output of the ADC at the time of no occurrence of clipping, where the clipping does not occur since an input signal of the ADC is within a range of an input signal that the ADC is able to receive.

5. The dynamic high-resolution ADC of claim 1, wherein the decoder is configured to control the second gain to be determined to be an output of the ADC at the time of no occurrence of clipping, where the clipping does not occur since an input signal of the ADC is within a range of an input signal that the ADC is able to receive.

6. The dynamic high-resolution ADC of claim 1, wherein the DAC is configured to:
   have an output initial value of 0 and be initialized to an initial value for every sampling period; and
   receive the output signal of the ADC input by the decoder and convert the output signal of the ADC into an analog signal.

7. The dynamic high-resolution ADC of claim 1, wherein the decoder is configured to:
   control the first gain of the dynamic amplifier and the second gain of the residue signal amplifier; and
   decode a digital signal into the digital data, based on the output signal of the ADC when the second gain is 1 and the output signal of the ADC when the second gain is not 1.

8. A method of converting analog to digital by a dynamic high-resolution analog to digital converter (ADC), the method comprising:

performing sampling and holding operation, in which a sample and hold circuit receiving an analog signal from a sensor samples the analog signal and holds a size of the analog signal during a sampling period;

performing a conversion operation of obtaining a first digital signal, in which a dynamic amplifier receiving the sampled-and-held analog signal from the sample and hold circuit amplifies a size of the sampled-and-held analog signal, and the sampled-and-held analog signal with the amplified size is converted into the first digital signal by a residue signal amplifier, which is configured to amplify a difference between two signals connected respectively through both inputs of the residue signal amplifier to and inputted by both of the dynamic amplifier and a digital to analog converter (DAC), and by an ADC, which is connected to the residue signal amplifier;

performing a conversion operation of obtaining a second digital signal, in which the ADC converts a signal not converted into the first digital signal among the sampled-and-held analog signal into a second digital signal; and performing a decoding operation, in which a decoder connected to the ADC decodes the analog signal into digital data based on the first digital signal and the second digital signal, wherein the decoder is connected to the dynamic amplifier and controls a first gain of the dynamic amplifier, and is connected to the residual signal amplifier and controls a second gain of the residue signal amplifier.

9. The method of claim 8, wherein the first digital signal is a signal, in which the sampled-and-held analog signal is controlled within a range of an input signal that the ADC is able to receive, and the controlled sampled-and-held analog signal is converted into a digital signal.

10. The method of claim 8, wherein the performing of the conversion operation of obtaining the first digital signal comprises:

operation A determining whether an output signal of the ADC, to which the sampled-and-held analog signal is input, is a maximum output signal of the ADC, based on the first gain of the dynamic amplifier and the second gain of the residue signal amplifier;

operation B controlling the first gain to be ½ of the current first gain, where an output signal of the ADC, to which the sampled-and-held analog signal is input, is a maximum output signal of the ADC;

operation C determining whether a number of loops is less than a maximum number of extension bits; and operation D, in which the ADC converts the sampled-and-held analog signal into the first digital signal, based on the controlled first gain, the maximum number of extension bits, and the second gain, where the number of loops is the maximum number of extension bits.

11. The method of claim 10, further comprising operation E determining a number of extension bits to be the number of loops and controlling the second gain with the first digital signal, where the output signal of the ADC, to which the sampled-and-held analog signal is input, is less than the maximum output signal of the ADC.

12. The method of claim 10, further comprising operation F increasing the number of loops by 1 and repeating operations A to D, where the number of loops is less than the maximum number of extension bits.

13. The method of claim 10, wherein:

the first gain is initialized to an initial value for every sampling period, and the second gain has an initial value of 1 and is initialized for every sampling period.

14. The method of claim 8, wherein the performing of the conversion operation of obtaining the second digital signal comprises:

amplifying, by as much as the second gain, a difference between the sampled-and-held analog signal amplified by the dynamic amplifier and the first digital signal converted into an analog signal by the DAC; and converting the amplified signal into a second digital signal by the ADC.

* * * * *